US005694284A

United States Patent [19]

Oda et al.

[11] Patent Number: 5,694,284

[45] Date of Patent: Dec. 2, 1997

[54] DISCHARGE TYPE SURGE ABSORBING ELEMENT AND METHOD FOR MAKING THE SAME

[75] Inventors: Seiichiro Oda, Takasaki; Junichi Ida; Akio Mukai, both of Kounosu; Yoshito Kasai, Suwa-Gun, all of Japan

[73] Assignee: Okaya Electric Industries Company, Ltd., Tokyo, Japan

[21] Appl. No.: 496,363

[22] Filed: Jun. 29, 1995

[30] Foreign Application Priority Data

| | | | |
|---|---|---|---|
| Jun. 29, 1994 | [JP] | Japan | 6-169942 |
| Jun. 29, 1994 | [JP] | Japan | 6-169943 |
| Nov. 2, 1994 | [JP] | Japan | 6-293814 |

[51] Int. Cl.[6] .......... H01L 7/12

[52] U.S. Cl. .......... 361/119; 337/28

[58] Field of Search .......... 361/118, 119, 361/120, 111, 124, 125, 130, 129; 337/28–33

[56] References Cited

U.S. PATENT DOCUMENTS 4,912,592 3/1990 Flindall et al. .......... 361/120

5,247,273 9/1993 Shibayama et al. .......... 337/16

*Primary Examiner*—Lincoln Donovan

*Attorney, Agent, or Firm*—Morrison Law Firm

[57] ABSTRACT

A discharge-type surge absorbing element that absorbs a surge by using the discharge that occurs between a discharge interval arranged within a sealed container filled with a discharge gas. The discharge-type absorbing element is characterized by a plurality of discharge electrodes connected to lead wires and disposed within a sealed container filled with a discharge gas. The discharge electrodes are disposed within the container so that they face each other and so that a discharge gap is formed between the discharge electrodes. The lead wire from each of the discharge electrodes passes through the sealed container and extends externally. A layer is disposed on the inside surface of the sealed container, at least between the lead wires. The layer has good creeping discharge properties and is made from the material in the discharge electrodes. A very small gap is formed between the lead wires and the end of the layer.

14 Claims, 14 Drawing Sheets

DISCHARGE TYPE SURGE ABSORBING ELEMENT AND METHOD FOR MAKING THE SAME

BACKGROUND OF THE INVENTION

The present invention relates to a discharge type surge absorbing element that absorbs a surge by using the discharge that occurs between a discharge interval arranged within a sealed container filled with a discharge gas. In particular, the present invention comprises an appropriate triggering means used for the main discharge at the discharge interval, thus improving the responsiveness of the surge absorbing element. The present invention also comprises a method for making such a surge absorbing element.

In the past, discharge-type surge absorbing elements have been used to absorb surges by taking advantage of discharging that occurs at a discharge gap within a sealed container. This type of surge absorber serves to protect electronic circuits from surges, such as transient overvoltages and lightning induced surges, that enter through signal lines and power supply lines. In these kinds of discharge-type surge absorbing elements, the surge is absorbed by an arc discharge, which acts as the main discharge. While this has the advantage of being able to handle high currents, it has the disadvantage of having a decreased responsiveness. In response to this problem, Japanese patent publications 5-7835 and 5-8736 attempted to improve the responsiveness by disposing a layer made from a dielectric having good creeping discharge properties between discharge electrodes.

Referring to FIG. 14, there is shown a discharge-type surge absorbing element 60. Discharge electrodes 62, 62 are formed as shafts comprising electrode base 62 covered by emitter layer **62*b*. Electrode base 62*a* comprises a metal such as a nickel having good discharge properties. Emitter layer 62*b* comprises barium oxide or the like. Discharge electrodes 62, 62 are disposed parallel to each other and separated by a prescribed discharge gap 64. The electrodes are sealed, along with discharge gas, within a sealed container 66 formed from a glass tube. Lead wires 68, 68 comprise a dumet wire or the like connected to the lower ends of discharge electrodes 62, 62 and extending outside of sealed container 66. A layer 70, comprising a dielectric having good creeping discharge properties such as nickel oxide, covers the inner surface of sealed container 66, at least between lead wires 68 68. (Referring to FIG. 14, there is shown an example where layer 70 covers roughly the entire inner surface of sealed container 66**.)

Discharge-type surge absorbing element 60 is connected in parallel to the electronic circuit to be protected via lead wires 68, 68 (not shown in the drawings). When a surge greater than a prescribed fixed value is applied to surge absorber element 60 via lead wires 68, 68, a creeping corona discharge is immediately generated at the surface of layer 70 between lead wires 68, 68, and surge absorption is begun. This creeping corona discharge is transferred to discharge gap 64 between discharge electrodes 62, 62 due to the priming effect of the electrons and ions emitted by this discharge. Glowing discharge takes place, and finally an arc discharge, the main discharge, occurs. The high current from this discharge acts to absorb the surge. Thus, surge absorbing element 60 uses the creeping corona discharge, which has a high responsiveness, to trigger the main discharge at discharge gap 64. In this way, this device seeks to provide an improved responsiveness to surges. It is true that there is an improvement in responsiveness in this device compared to a device that does not have layer 70. However, the amount of electrons and ions emitted from the creeping corona discharge is not great, and therefore, the responsiveness of surge absorbing element 60 still left something to be desired.

Referring to FIG. 15, there is shown a detail drawing of the connection between lead wires 68, 68 and sealed container 66. A plurality of secondary discharge electrodes 72, comprising particles or lumps of dielectric material such as nickel, are scattered on the surface of layer 70. In such a device, it is proposed that a plurality of secondary discharge gaps 74, much narrower than discharge gap 64, be formed. This basically serves to generate aerial discharges at secondary discharge gaps 74 within the main discharge at discharge gap 64, thus seeking to provide smoother generation of the main discharge at discharge gap 64. Indeed, because the secondary discharge gaps 74 are much narrower than discharge gap 64, and because the distance to layer 70 is much closer, aerial discharge can take place within a shorter period at secondary discharge gaps 74. Furthermore, the aerial discharge emits far more electrons and ions compared to creeping corona discharge, thus allowing quicker generation of a main discharge at discharge gap 64.

The following is a description of one example of a method for making surge absorbing element 60. First, an emitter material comprising barium carbonate is attached to the surface of nickel electrode base **62*a*, 62*a*, which are connected to lead wires 68, 68. The emitter material is attached so that part of the surface of base electrodes 62*a*, 62*a*** is exposed.

Next, lead wires 68, 68 are aligned in the same direction and kept in alignment by an alignment tool. Electrode base **62*a*, 62*a* are disposed parallel to each other, separated by a prescribed distance. This is inserted into the bottom opening of a glass tube having two open ends. The entire length of lead wires 68, 68** is not disposed within the glass tube, and the lower ends of the leads are left extending outward from the bottom opening of the glass tube.

Next, the bottom opening of the glass tube is heated by a gas flame and fused. This fused section is collapsed inward by a pincher, and the bottom opening of the glass tube is sealed. The central portion of lead wires 68, 68 are fixed by the sealed portion of the glass tube, and the lower ends of lead wires 68, 68 extend outward from the bottom end of the glass tube. Because the heating of the glass tube is done in air, the exposed portions of electrode base **62*a*, 62*a*** (not shown in the drawing) are oxidized, forming nickel oxide.

Next, an evacuation device is connected to the upper opening of the glass tube, and evacuation of the tube is begun. During the evacuation process, the glass tube is disposed within a high-frequency coil while it is still connected to the evacuation device, and high-frequency heating is performed at the same time as the evacuation. This heating causes the barium carbonate of the emitter to thermally decompose, forming emitter layers **62*b*, 62*b*, comprising barium oxide, on the surface of electrode base 62*a*, 62*a*. This forms discharge electrodes 62, 62. At the same time, the heating process causes the exposed areas of the surface of electrode base 62*a*, 62*a*** to become fluid, and the decompression of the glass tube from the evacuation causes the fluid material to scatter.

In the early stages of the evacuation process, the high concentration of residual air within the glass tube causes the molten nickel of electrode base **62*a*, 62*a* to become oxidized while scattering, thus forming nickel oxide. This, along with the nickel oxide formed on the surface of electrode base 62*a*, 62*a*, adheses to the inner surface of the glass tube as a layer, forming layer 70. Also, pan of the barium oxide making up emitter layer 62***b*, 62*b* scatters, mixing into layer 70.

As heating continues, the residual air concentration within the glass tube decreases as the evacuation process progresses, until finally the scattered nickel is no longer oxidized. Referring to FIG. 15, if the heating operation is stopped at the point where the unoxidized nickel attaches in a scattered fashion to the surface of layer 70, then this would result in a plurality of secondary discharge electrodes 72 being disposed on the surface of layer 70. Secondary discharge electrodes 72 would be conductive and would be formed as particles or lumps.

The evacuation procedure completely eliminates residual air, carbon dioxide resulting from the decomposition of barium carbonate, and gas impurities emitted from the glass tube itself as well as parts within the glass tube, resulting in a high vacuum state in the glass tube. Following this, the glass tube is filled with discharge gas. Then, the upper opening of the glass tube is heated, fused, sealed and cut, thus completing sealed container 66.

According to this method for making the glass container, the following conditions can be set appropriately: the heating temperature; the heating time; conditions regarding evacuation speed and the like; the melting temperature and decomposition temperature of the material in discharge electrodes 62, 62; and the oxidation speed. This makes it is possible to form layer 70 and secondary discharge electrodes 72 without using special materials or procedures, and has the advantage of making manufacture simpler.

However, it is difficult to accurately control the melting and scattering processes of the metal (nickel) in electrode base 62*a*. Thus some of the metal particles 76 that should be scattered on the surface of layer 70 inevitably end up being embedded and mixed inside layer 70. This results in the insulation resistance of layer 70 itself being decreased. With the insulation resistance of layer 70 decreased in this manner, if a surge is applied, the creeping corona discharge between lead lines 68, 68 stays suspended without being able to create a main discharge in discharge gap 64. In extreme cases, this kind of suspended creeping corona discharge can result in layer 70 peeling off, or partially melting or scattering due to heat. Thus, when the next surge is applied, the creeping corona discharge that serves as the triggering means does not take place, creating the danger of delayed discharge in discharge gap 64.

A very small amount of metal particles 76 being mixed in does not pose a problem, of course, but it is necessary to distribute secondary discharge electrodes 72 on the surface of layer 70 at a density beyond a certain threshold in order to realize aerial discharges at secondary discharge gaps 74. Thus, layer 70 is mixed in with and embedded with an amount of metal particles 76 that can not be ignored.

The above, and other objects, features and advantages of the present invention will become apparent from the following description read in conjunction with the accompanying drawings, in which like reference numerals designate the same elements.

OBJECT AND SUMMARY OF THE INVENTION

The object of the present invention is to realize a discharge-type surge absorbing element that overcomes the problems that accompany the prior art discharge-type surge absorbing element described above.

In order to achieve this object, the discharge-type surge absorbing element of the present invention is characterized by the following description. A plurality of discharge electrodes, connected to lead wires, disposed within a sealed container filled with a discharge gas. The discharge electrodes are disposed so that they face each other and so that a discharge gap is formed between the discharge electrodes. The lead wire from each of the discharge electrodes passes through the sealed container and extend externally. A layer is disposed on the inside surface of the sealed container, at least between the lead wires. The layer has good creeping discharge properties and is made from the material in the discharge electrodes. A very small gap is formed between the lead wires and the end of the layer.

When a surge is applied to this discharge-type surge absorbing element via the lead wires, the electric field strength between the lead wires and the ends of the layer increases. This leads to electrons and ions being emitted in the very small gap in numbers far greater than in the case of creeping corona discharge. The priming effect from this large number of electrons and ions is able to generate an arc discharge, which serves as a main discharge, at the discharge gap much quicker than the use of a creeping corona discharge alone as a trigger.

Thus, arranging a very small gap between the lead wires and the ends of the layer, it is possible to improve the response speed. Thus, it is unnecessary to form a secondary discharge gap by arranging a plurality of secondary discharge electrodes on the layer surface. However, in order to achieve a further improvement in responsiveness, it is possible to dispose a plurality of secondary discharge electrodes in a scattered fashion on the surface of the layer. The secondary discharge electrodes are made from the material in the discharge electrodes, and have conductive properties. In this case, the insulation between the lead wires and the ends of the layers is maintained by the presence of very small gaps. In the present invention, it is possible for conductive material (metal particles) to be embedded or mixed into the layer during the manufacturing process of the secondary discharge electrode, thus decreasing the insulation resistance of the layer itself. However, even if this occurs, the present invention does not have the prior art problem wherein a suspended creeping corona discharge takes place between the lead wires when a surge is received, thus preventing the generation of a main discharge at the discharge gap.

The very small gap can be formed in the following manner. The discharge electrodes are heated within an decompressed oxidizing atmosphere, melting the material in the discharge electrode so that the material scatters and oxidizes. This oxidized material attaches to the inner surface of the sealed container, forming a layer. At the same time, the area in the inner surface of the sealed container that connects with the lead wires is melted, thus preventing the oxidized material from attaching to the surface of this connection area.

Instead of forming a very small gap between the ends of the layer and the lead wires, it would also be possible to form a notch by eliminating a part of the layer, at least in the section between the lead wires. This notch can be formed, for example, as a band having a width of 50–300 micrometer that goes between the lead wires. It would also be possible to form a cavity in the inner surface of the sealed container at an area corresponding to the notch.

This notch serves essentially the same function as the very small gap above. In other words, when a surge is applied, ions and electrons are emitted at the notch in far greater numbers than would be emitted by creeping corona discharge. The priming effect from this makes it possible to quickly generate a main discharge at the discharge gap. Also, a plurality of secondary discharge electrodes, having conductive properties and made from the same material in the discharge electrodes, can be scattered on the surface of the layer. The layer is insulated between the lead wires by the notch, even if the layer has an overall decrease in insulation resistance because of conductive material embedded and mixed in with the layer. Thus, the insulation of the section between the lead wires is maintained, so that creeping corona discharge will not stay in a suspended state between the lead wires.

This notch can be easily formed by, for example, using a glass sealed container, and shining a laser beam shined from outside the sealed container after the layer on the inside surface of the sealed container is formed. The laser would be used to evaporate parts of the layer.

In order to lower the initial discharge voltage of the discharge electrodes, and to prevent sputtering at the discharge electrodes, it would be possible to form the discharge electrodes by forming an emitter layer on the surface of the electrode base. In this case, the emitter material would be attached to just the ends of the plurality of the shaft-shaped electrode bases connected to the lead wires. This emitter material would be thermally decomposed so that an emitter layer would be formed just on the surface of the tips of the electrode base. No emitter layer is formed at the surface of the end of the electrode base connected to the lead wires, thus forming an exposed portion. The layer and the secondary discharge electrodes would be formed by melting and scattering the surface of the exposed portion. In this way the layer can be formed with an adequate thickness between the lead wires by forming an emitter layer over only a part of the electrode base, having an exposed portion at the bottom end of the electrode base where there is no emitter layer, and having the material from the exposed area form the layer and the secondary discharge electrodes. This also allows the secondary electrodes to be formed at an adequate density on the layer. It would be desirable for the exposed portion to have a length of one-third or more of the overall length of the electrode base.

The electrode base and the secondary discharge electrode can be made from a material such as nickel. The main material in the layer can be a material such as nickel oxide. The discharge electrodes can be disposed so that their bodies are disposed parallel to each other and separated by the discharge gap. In this case, each of their lead wires are extended outside the sealed container in the same direction. Or, the discharge electrodes can be disposed so that their ends face opposite directions and are separated by the discharge gap. In this case, the lead wires would be extended in opposite directions from the sealed container.

The present invention is not restricted to discharge-type surge absorbing elements as described above wherein discharge electrodes connected to lead wires are sealed within a sealed container. For example, it would also be possible to form a sealed container with a case open on both ends. The holes would be fitted with discharge electrodes, which would also serve as covers for the holes. A discharge gap would be formed between the tips of the discharge electrodes in the sealed container. The sealed container would be filled with discharge gas, and a layer having good creeping discharge properties would be formed on the inner surface of the case. A very small gap would be formed between the discharge electrodes and the ends of the layer.

DETAILED DESCRIPTION OF THE PREFERRED EMBODIMENTS

Figure 1:
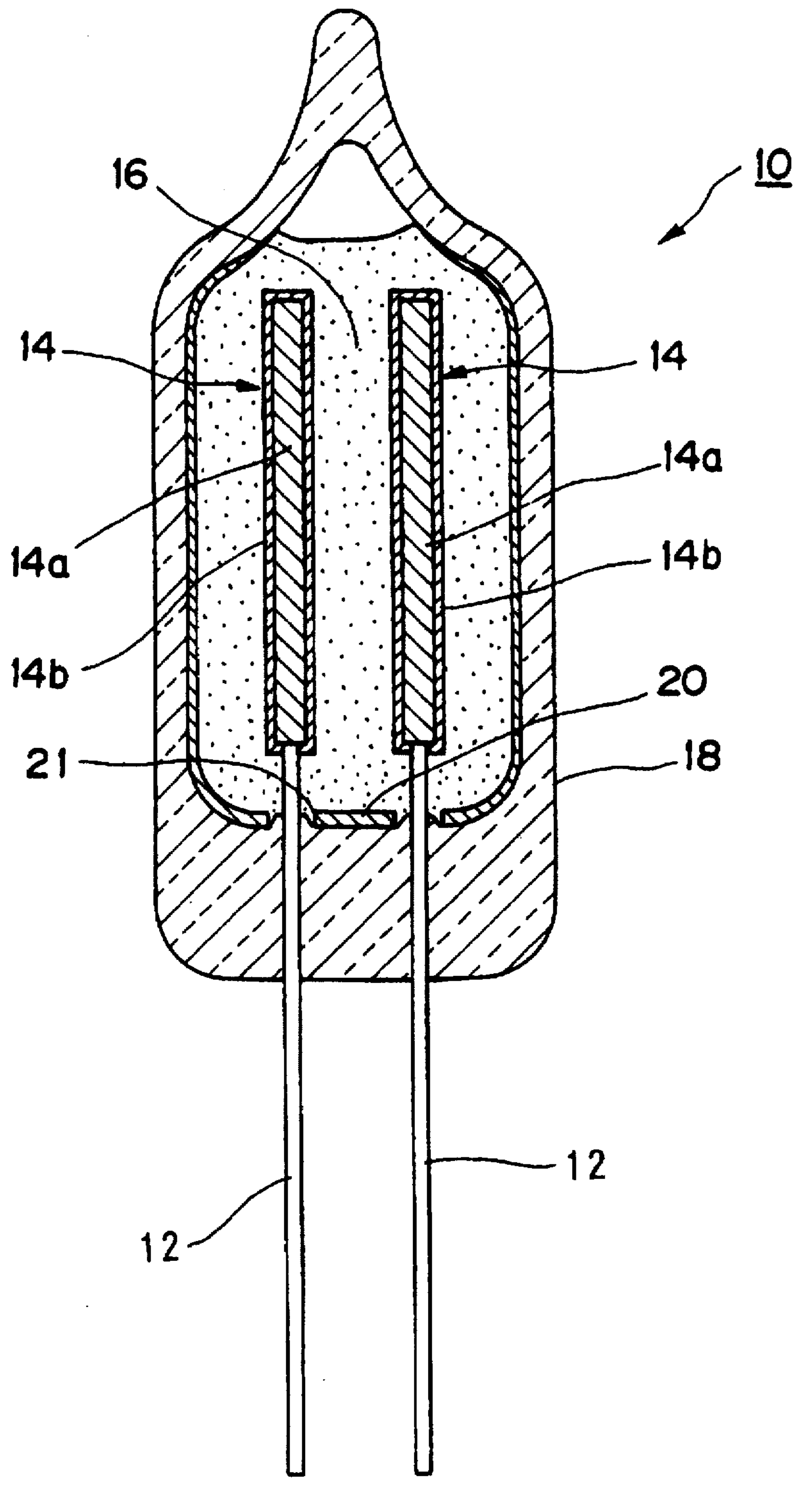
FIG. 1 is a cross-section drawing showing the first discharge-type surge absorbing element of the invention.

Referring to the drawings, the following is a description of the embodiments of the present invention. Referring to FIG. 1, there is shown a vertical cross-section drawing of an embodiment of a first discharge-type surge absorbing element 10 of the present invention. In first discharge-type surge absorbing element 10, a pair of discharge electrodes 14, 14, connected to lead wires 12, 12 on one end, is disposed so that they are parallel to each other and are separated by a prescribed distance. This is sealed inside a sealed container 18 formed from a glass tube. Lead wires 12 of discharge electrodes 14 are extended outside sealed container 18. A discharge gas comprising a noble gas, nitrogen gas, or a sulphur hexafluoride gas is sealed within sealed container 18. Discharge electrodes 14 comprise electrode bases 14a which are made from a metal having good discharge properties such as nickel that is processed in long thin shafts or plates. The surfaces of electrode bases 14*a* are covered with emitter layers 14*b*, made from barium oxide or the like. Lead wires 12 comprise dumet wire (an iron-nickel alloy covered by copper) or the like.

Figure 2:
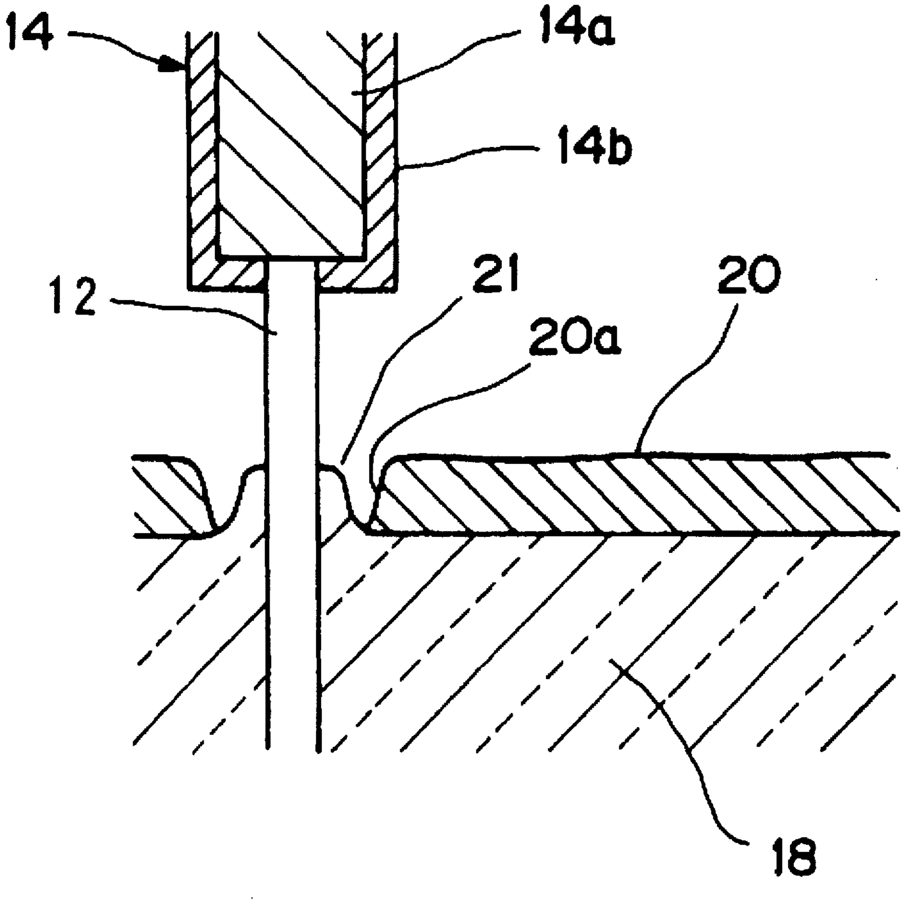
FIG. 2 is an enlarged cross-section drawing showing the area where the lead wires and the inner surface of the sealed container connect in the first discharge-type surge absorbing element of the present invention.

A layer 20 is formed on the inside surface of sealed container 18. Layer 20 comprises a dielectric having good creeping discharge properties such as nickel oxide. Referring to FIG. 2, there is shown an enlarged drawing of the area where lead wire 12 and the inner surface of sealed container 18 connect. A very small gap 21 having a width of 10–300 micrometers is formed between lead wire 12 and an edge 20*a* of layer 20 between lead wires 12, 12. Very small gap 21 insulates lead wires 12, 12 and layer 20 from each other.

The following is a description of one example of a method for making first discharge-type surge absorbing element 10. An emitter material comprising barium carbonate is attached to the surface of nickel electrode bases 14*a*, 14*a*, which are connected to lead wires 12, 12. The emitter material covers the surface while leaving one part exposed. Lead wires 12, 12 are disposed in the same direction. An alignment tool is used to keep lead wires 12, 12 in alignment, while electrode bases 14*a*, 14*a* are kept parallel to each other, and this is inserted into a glass tube, which has two open ends. The bottom ends of lead wires 12, 12 are extended outside from the lower opening of the glass tube. A gas flame is used to heat the bottom end of the glass tube, and the melted portion is collapsed inward and sealed with a pincher. The middle portion of lead wires 12, 12 are fixed at the lower sealed end of the glass tube, and the bottom ends of lead wires 12, 12 are extended outward from the glass tube. Because the heating of the glass tube is done in air, the exposed portion of the surface of electrode bases 14*a*, 14*a* (not shown in the drawing) is oxidized, forming nickel oxide.

An evacuation device is connected to the upper opening of the glass tube, and evacuation of the tube is begun. While this evacuation process is being performed, the glass tube is disposed within a high-frequency coil while it is still connected to the evacuation device. When evacuation is performed at the same time as high-frequency heating, the barium carbonate of the emitter material thermally decomposes, forming emitter layers 14*b*, 14*b*, comprising barium oxide. This completes the formation of discharge electrodes 14, 14. At the same time, the exposed portions of the surface of electrode bases 14*a*, 14*a* are melted, and the decompression within the glass tube from evacuation results in scattering of the melted material. In the initial stages of the evacuation process, there is a high residual air density within the glass tube. This causes the nickel making up electrode bases 14*a*, 14*a* to oxidize during scattering, forming nickel oxide. This nickel oxide, along with the nickel oxide formed on the surface of electrode bases 14*a*, 14*a* in the previous process, forms a layer on the inside surface of the glass tube. This results in a layer 20 of nickel oxide, which has good creeping discharge properties.

When electrode bases 14*a*, 14*a* are heated as described above, high-frequency heating is performed on lead wires 12, 12 as well. Lead wires 12, 12 are heated to a high temperature, and the inner surface of sealed container 18 is melted around the area where it connects with lead wires 12, 12. Thus, if nickel oxide scatter from electrode bases 14*a*, 14*a* onto the melted area, it would immediately be embedded inside the layer, and would not adhese to the surface. (The melting and softening temperature of glass is lower than the temperature at which the nickel and nickel oxide from electrode bases 14*a*, 14*a* melts and scatter. Therefore, the glass stays in a melted state even after scattering is completed, so that nickel oxide does not adhese to the surface.) Since there is a low-pressure atmosphere within the glass tube, the melted glass forms a bulge toward electrode bases 14*a*, 14*a* along lead wires 12, 12. Once the heating process is complete, and the temperature has cooled, very small gap 21 is formed between lead wires 12 and edge 20*a* of layer 20.

Residual air, carbon dioxide from the decomposition of the barium carbonate, and gas impurities emitted from the glass tube itself as well as parts within the glass tube are eliminated completely by the exhaust procedure. Then, the glass tube is filled with discharge gas. The top opening of the glass tube is heated, fused, cut and sealed, forming sealed container 18.

With this manufacturing method described above, the following settings can be set appropriately to achieve optimal conditions: the heating points; the heating temperature; heating time; exhaust speed; the melting and decomposing temperatures or oxidizing speeds of each of the pans. This allows layer 20 and very small gap 21 to be formed without requiring special materials or procedures, thus simplifying the production process.

When a surge greater than a certain fixed value is received by first discharge-type surge absorbing element 10 via lead wires 12, 12, a creeping corona discharge is generated immediately on the surface of layer 20, and surge absorption begins. The electric field strength between lead wire 12 and layer edge 20*a* increases, and a large number of electrons and ions are emitted at very small gap 21. This priming effect transfers the creeping corona discharge over discharge gap 16 over a short period of time. In discharge gap 16, a glow discharge is generated, and then an arc discharge, serving as a main discharge, takes place. This brings about the full-scale absorption of the surge.

Compared to triggering the main discharge by using the electrons and ions emitted from just the creeping corona discharge, the formation of very small gap 21 between lead wires 12, and layer edge 20*a* provides a far greater number of electrons and ions that are emitted. This improves the responsiveness to a surge. It would not be possible to have this kind of electron and ion emission at very small gap 21 if layer 20 were completely insulated. However, layer 20 is formed, as described above, by nickel, which is a dielectric, scattering and oxidizing. Thus, layer 20 has high resistance as well as some degree of dielectric properties. This allows a large number of electrons and ions to be emitted at very small gap 21 when a surge is applied.

Figure 3:
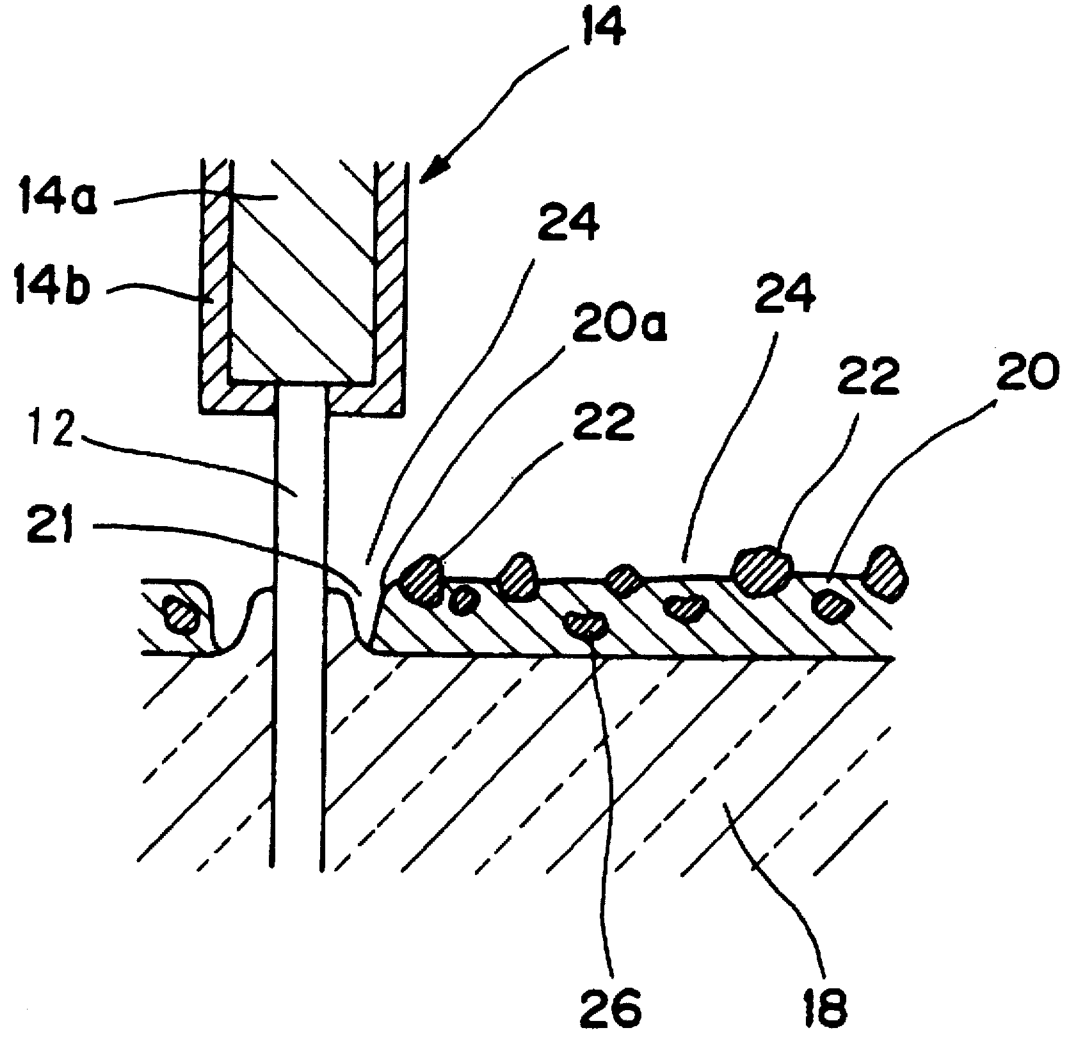
FIG. 3 is an enlarged cross-section drawing showing an alternative example of the area where the lead wires and the inner surface of the sealed container connect in the first discharge-type surge absorbing element of the present invention.

If application of heat to electrode bases 14*a*, 14*a* is not stopped immediately after layer 20 is formed, and instead, heat is applied for a while longer, then the residual air concentration within the glass tube will decrease as the evacuation process continues, until finally, the scattered nickel will not be oxidized. Referring to FIG. 3, if the operation is halted once the unoxidized nickel scatters on the surface of layer 20, then a plurality of secondary discharge electrodes 22 would be formed comprising particles or lumps having conductive properties. Also, a plurality of secondary discharge gaps 24 would be formed between secondary discharge electrodes 22, as well as between secondary discharge electrodes 22 and lead wire 12. These secondary discharge gaps 24 are considerably more narrow than discharge gap 16 between discharge electrode 14, 14. Also, the distance from the surface of layer 20 is short. Thus, when a surge is applied, an aerial discharge is generated at secondary discharge gaps 24 over a very short span of time. Thus, there is also a priming effect of the electrons and ions in this discharge, making it possible to provide quicker generation of a main discharge in discharge gap 16.

When this method is used, metal particles 26, which serve as secondary discharge electrodes 22, inevitably are embedded and mixed into layer 20 during formation of secondary discharge electrodes 22. Very small gap 21 is formed between lead wire 12 and layer edge 20*a*, thus keeping them insulated from each other. This prevents the prior art problem wherein an incoming surge generates a sustained creeping corona discharge, keeping an are discharge from being generated at discharge gap 16.

Figure 4:
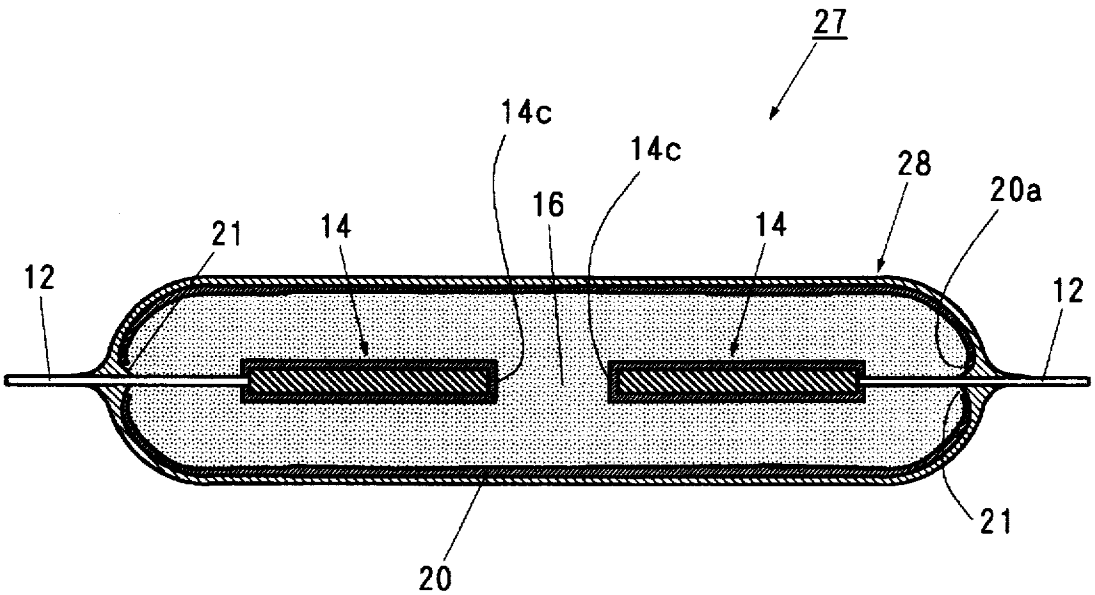
FIG. 4 is a cross-section drawing of the second discharge-type surge absorbing element of the present invention.

In first discharge-type surge absorber element 10, a pair of discharge electrodes 14, 14 are arranged in the same direction and are disposed parallel to each other. However, the discharge-type surge absorbing element of the present invention is not restricted to this configuration. Referring to FIG. 4, it would also be possible to have a second discharge-type surge absorbing element 27 wherein a pair of discharge electrodes 14, 14 are disposed so that ends 14*c*, 14*c* are disposed in opposite directions and separated by a discharge gap 16. This, along with discharge gas, would be sealed inside a sealed container 28, comprising a glass tube open on both ends which is then sealed. Lead wires 12, 12 from discharge electrodes 14, 14 would be extended in opposite directions from sealed container 28. Other configurations would essentially be identical to first discharge-type surge absorbing element 10. In other words, there would be a layer 20 covering the inside surface of sealed container 28 wherein layer 20 comprises a dielectric material having good creeping discharge properties such as nickel oxide. A very small gap 21 having a 10–300 micrometer width would be formed between lead wire 12 and layer end 20*a*. It would also be possible to have a configuration wherein a plurality of secondary discharge electrodes, comprising particles of conductive material such as nickel, is scattered on the surface of layer 20, and secondary discharge gaps are formed between the secondary discharge electrodes as well as between lead wire 12 and the secondary discharge electrodes.

Figure 5:
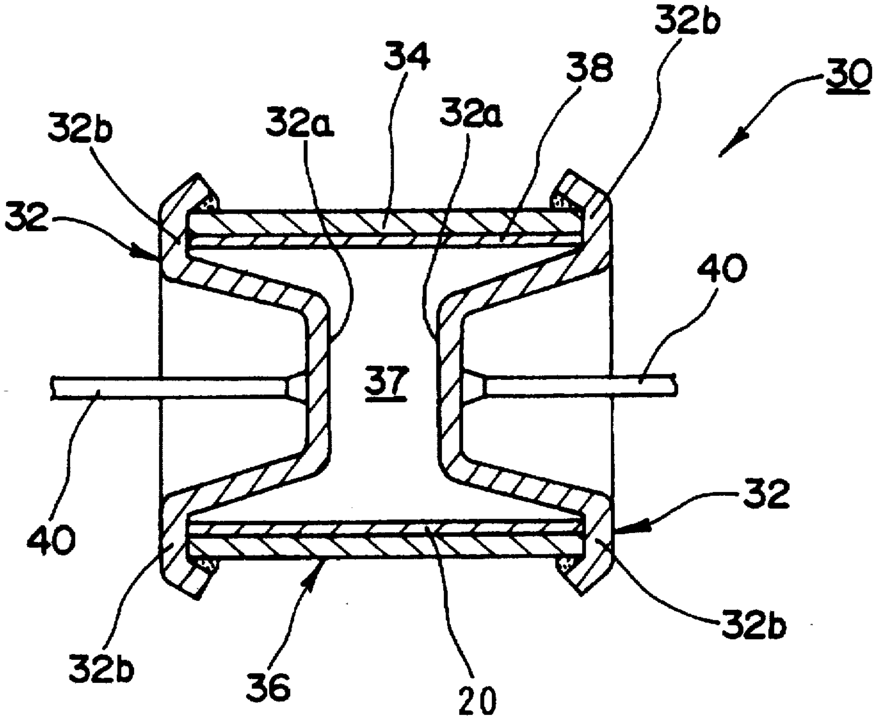
FIG. 5 is a cross-section drawing of the third discharge-type surge absorbing element of the present invention.

Referring to FIG. 5, there is shown a third discharge-type surge absorbing element 30 of the present invention. In third discharge-type surge absorbing element 30, hat-shaped discharge electrodes 32 comprise metal having good discharge properties, such as nickel and iron, or an alloy of these. Discharge electrodes 32 also serve as covers for a cylindrical case 34 having two open ends and comprising an insulated material such as ceramic or the like. Discharge electrodes 32 fit into and seal the two open ends of case 34, forming a sealed container 36. Ends 32*a*, 32*a* of opposing discharge electrodes 32, 32 form a discharge gap 37. A layer 20 is formed on the inner surface of case 34. Layer 20 is formed by vaporization, spraying, painting or the like using material identical to that described for the above embodiment (i.e. a material having good creeping discharge properties composed mainly of nickel oxide). A discharge gas comprising a noble gas and a nitrogen gas or sulfur hexafluoride gas or the like is sealed within sealed container 36. Lead wires 40 are connected to the outer surface of discharge electrodes 32.

Figure 6:
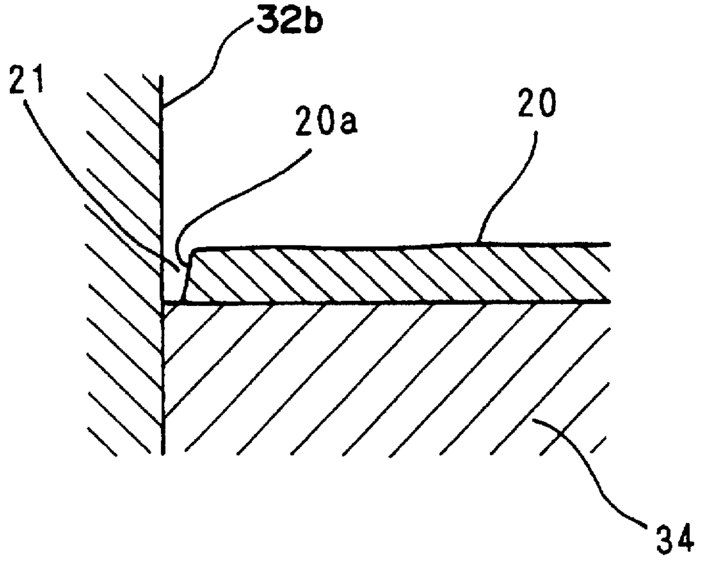
FIG. 6 is an enlarged cross-section drawing of the area around the very small gap of the third discharge-type surge absorbing element.

Referring to FIG. 6, very small gap 21 having a width of 10–300 micrometers is formed between layer edge 20*a* of layer 20 and the inner surface of a rim 32*b* of discharge electrode 32. Thus, as in the above embodiment, when a surge is applied, the electric field strength increases between layer edge 20*a* and the inner surface of rim 32*b* of the discharge electrode. This causes a large number of electrons and ions to be emitted at very small gap 21, thus allowing quicker generation of a main discharge at discharge gap 37. Very small gap 21 is formed by grinding, polishing, laser processing, or the like following the formation of layer 20 over the entire inner surface of case 34. This allows the ends of layer 20 to be cut at the necessary width.

Although it is not shown in the drawings, a plurality of secondary discharge electrodes, comprising particles or lumps having conductive properties, are scattered over the surface of layer 20. Secondary discharge gaps considerably narrower than discharge gap 37 are formed between secondary discharge electrodes as well as between secondary discharge electrodes and the inner surface of rim 32*b* of the discharge electrode.

Figure 7:
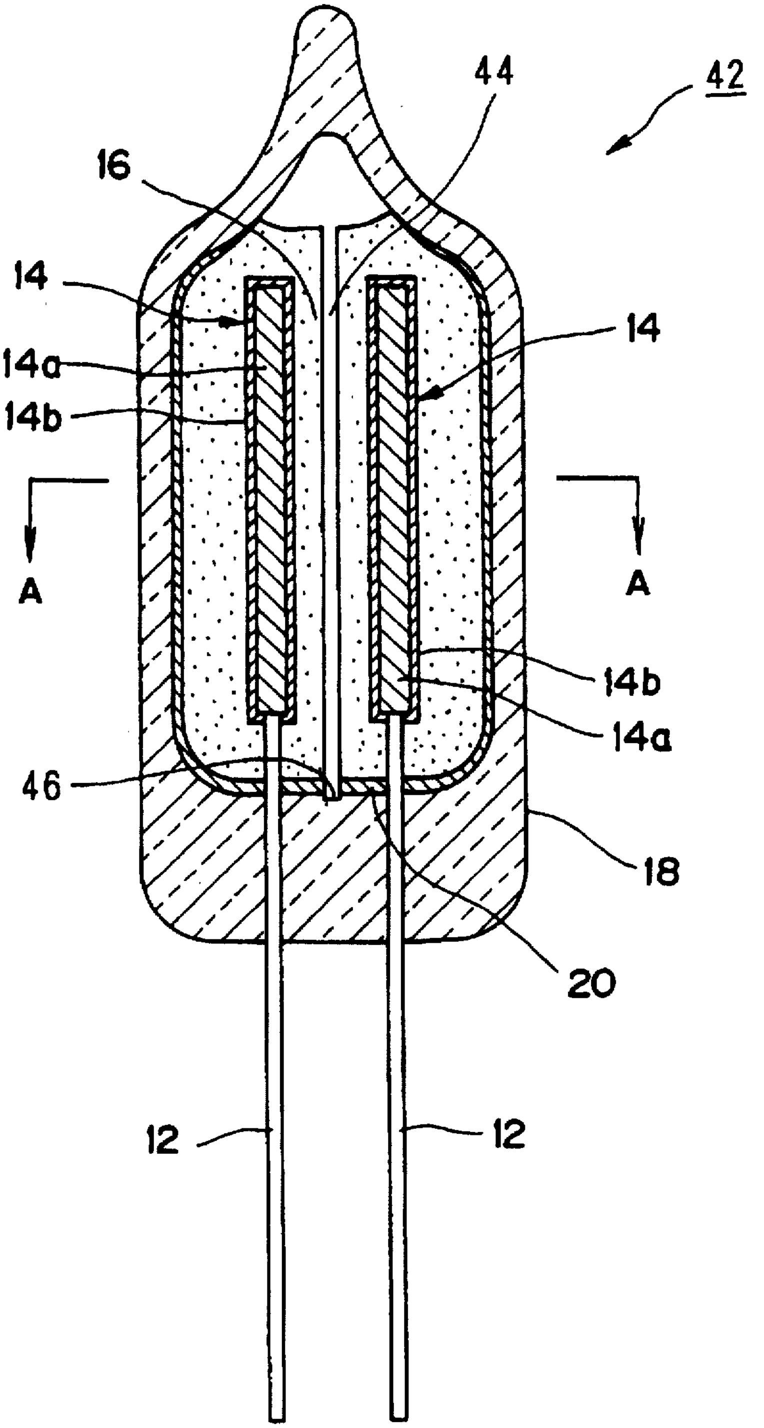
FIG. 7 is a cross-section drawing showing the fourth discharge-type surge absorbing element of the present invention.
Figure 8:
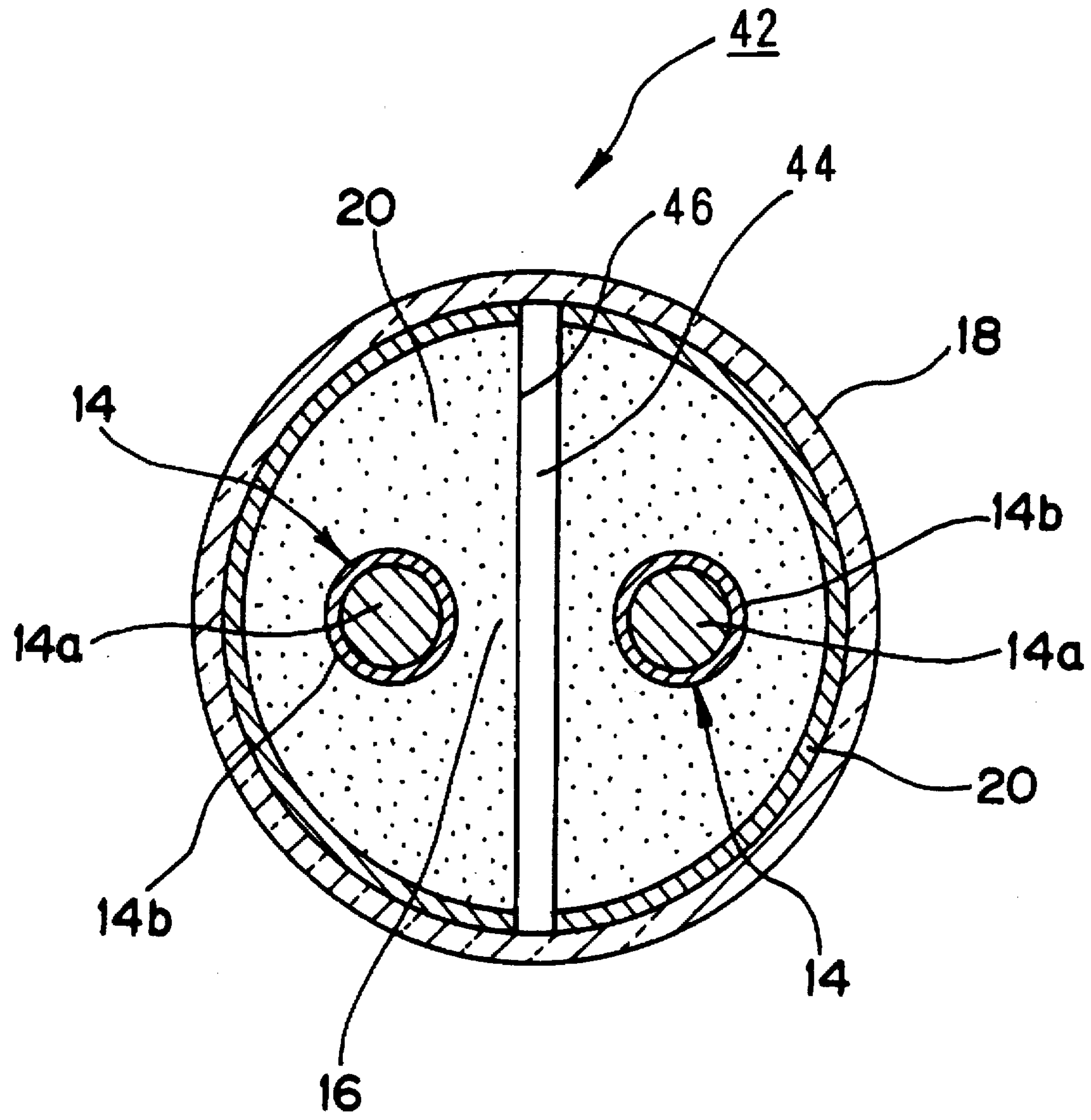
FIG. 8 is a cross-section drawing along the A—A line in FIG. 7.

Referring to FIG. 7, there is shown a vertical cross-section drawing of a fourth discharge-type surge absorbing element of the present invention. Referring to FIG. 8, there is shown a cross-section of FIG. 7 along the A—A line. In fourth discharge-type surge absorbing element 42, the basic configuration is identical to that of first discharge-type surge absorbing element described above. Namely, a pair of discharge electrodes 14, 14 connected on one end to lead wires 12, 12 are disposed parallel to each other separated by a prescribed distance, and discharge gap 16 is formed between the discharge electrodes. This is sealed within sealed container 18, formed from a glass tube. Lead wires 12 from discharge electrode 14 are extended outside sealed container 18. In discharge electrode 14, an emitter layer 14*b*, comprising barium oxide or the like, covers the surface of discharge electrode 14, which comprises a metal having good discharge properties such as nickel or the like, and which is processed into a shaft or a plate shape. Lead wire 12 comprises a dumet wire (a nickel alloy wire with a copper coating) or the like.

Figure 9:
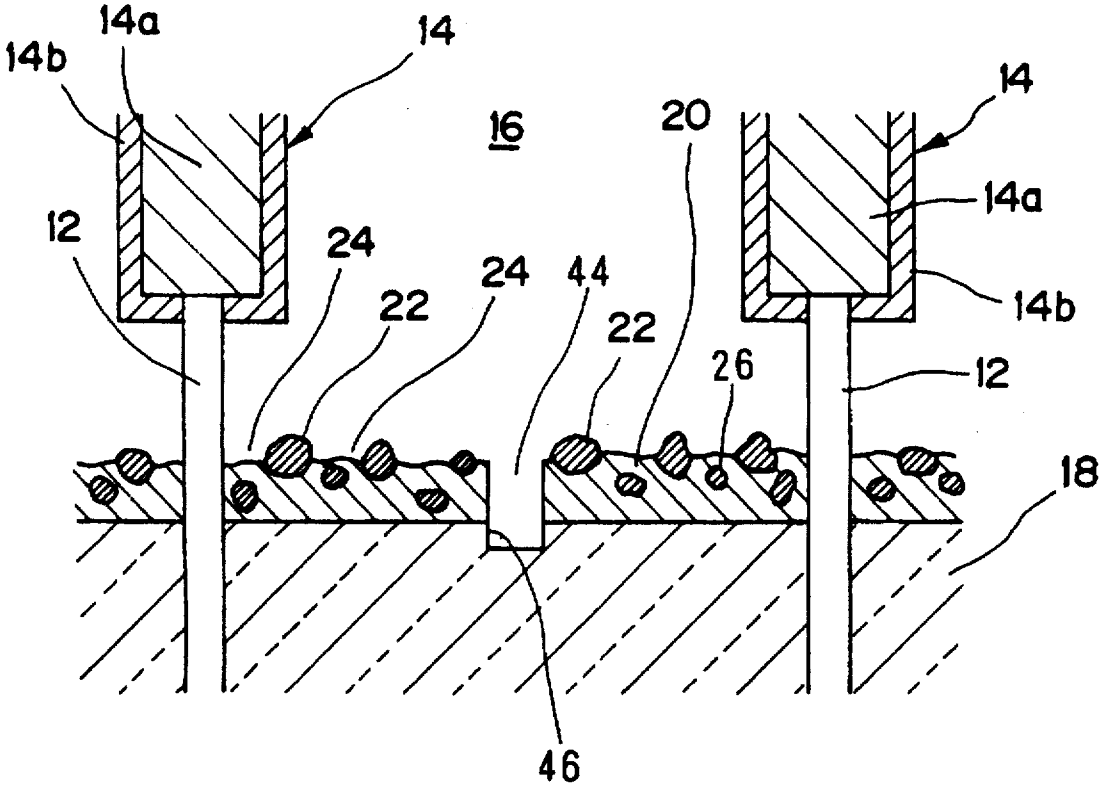
FIG. 9 is an enlarged cross-section drawing showing the area where the lead wires and the inner surface of the sealed container connect in the fourth discharge-type surge absorbing element.

A discharge gas such as a noble gas, nitrogen gas, or sulfur hexafluoride gas is sealed within sealed container 18. Layer 20, which has good creeping discharge properties and comprises nickel oxide or the like, covers the inner surface of sealed container 18. Referring to FIG. 9, a plurality of secondary discharge electrodes 22, comprising particles or lumps or a metal having good discharge properties such as nickel, scattered on the surface of layer 20, at least in the area between lead wires 12, 12. A plurality of secondary discharge gaps 24, which are considerably narrower than discharge gap 16 between discharge electrodes 14, 14, are formed between secondary discharge electrodes 22 as well as between lead wire 12 and secondary discharge electrodes 22.

In first discharge-type surge absorbing element 10, very small gaps are disposed between the ends of layer 20 and lead wires 12. However, in fourth discharge-type surge absorbing element 42, pan of layer 20 is eliminated to form a notch 44. Notch 44 is formed as a band having a width of 50–300 micrometers. Referring to FIG. 9, the area of layer 20 disposed between lead wires 12, 12 is divided near the middle by notch 44. The area at the inner surface of sealed container 18 corresponding to notch 44 has a very thin cavity 46 formed with a depth of 20 micrometers or less.

Notch 44 is formed by shining a YAG laser beam from outside sealed container 18 following the formation of layer 20 and secondary discharge electrodes 22 on the inner surface of sealed container 18. The laser passes through the glass of sealed container 18, and reaches layer 20 at the inner surface of sealed container 18, evaporating layer 20. By moving the positioning of the leaser beam according to a prescribed pattern, band-shaped notch 44 is formed. The laser passes through the glass so it does not melt the glass directly, but the heating and melting of layer 20 due to absorption of the laser causes the inner surface of sealed container 18 to become concave. As a result, a concavity 46 is formed in a pattern matching that of notch 44 at a position corresponding to notch 44 at the inner surface of sealed container 18.

Thus, in this embodiment, a glass tube or the like is sealed to form sealed container 18, after which a laser is shined from outside to evaporate part of layer 20 formed on the inner surface of sealed container 18. This allows notch 44 to be formed very easily. Also, it is possible to form notch 44 in pre-existing discharge-type surge absorbers, so this procedure can contribute to the effective use of pre-existing surge absorbers in inventory.

Notch 44 essentially serves as a very small gap, and as in the above embodiment, serves to improve the responsiveness to surges. When a surge is applied, the electric field strength at notch 44 (very small gap) increases significantly, and a large number of electrons and ions are emitted. This functions as a trigger, and quickly generates aerial discharge at secondary discharge gap 24, and also quickly generates an arc discharge at discharge gap 16. Furthermore, a concavity 46 is formed in the inner surface of sealed container 18 at a position corresponding to notch 44. This lengthens the creeping distance between lead wires 12, 12, thus increasing the lifespan against repeated incoming surges.

In fourth discharge-type surge absorbing element 42, metal particles 26, which serve as material for secondary discharge electrodes 22, inevitably are embedded into and mix into layer 20 when secondary discharge electrodes 22 are being formed. However, because of notch 44 that cuts across lead wires 12, 12, lead wires 12, 12 are kept insulated. Therefore, this embodiment avoids the problem of the prior an wherein a low insulation resistance between lead wires 12, 12 causes a sustained creeping corona discharge between lead wires 12, 12 during an incoming surge, thus preventing an arc discharge from being generated at discharge gap 16.

Figure 10:
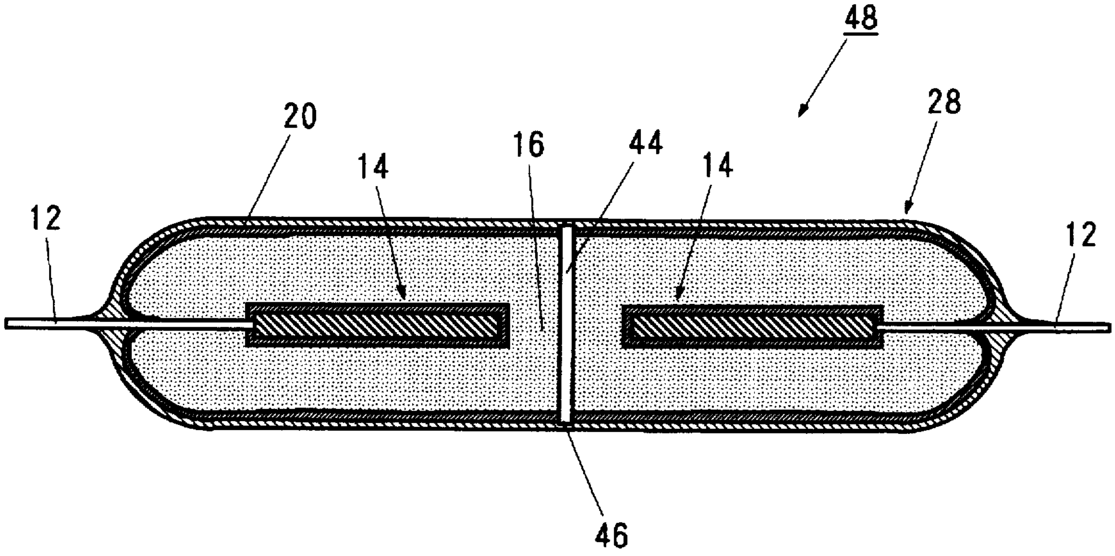
FIG. 10 is a cross-section drawing showing the fifth discharge-type surge absorbing element of the present invention.

Referring to FIG. 10 there is shown a fifth discharge-type surge absorbing element 48 of the present invention. In this embodiment, a pair of discharge electrodes 14, 14 are disposed opposite to each other so that their ends 14*c*, 14*c* are separated by discharge gap 16. This, along with discharge gas, is sealed within sealed container 28, which is formed by sealing the two open ends of a glass tube. Lead wires 12, 12 of discharge electrodes 14, 14 extend outside of sealed container 28 in opposite directions. The other elements of the configuration are essentially identical to that of fourth discharge-type surge absorbing element 42. Namely, the inner surface of sealed container 28 is covered with layer 20, which comprises a dielectric having good creeping discharge properties such as nickel oxide or the like. Although it is not shown in the drawings, a plurality of secondary discharge electrodes, comprising particles of conductive material such as nickel, are scattered on the surface of layer 20. Secondary discharge gaps are formed between the secondary discharge electrodes as well as between lead wire 12 and the secondary discharge electrodes. Furthermore, by beaming a YAG laser from the outside of sealed container 28 along the outer perimeter, notch 44 having a width of 50–300 micrometers is formed on layer 20 as a circle along the inner perimeter of sealed container 28. Notch 44 serves to divide layer 20 between lead wires 12, 12. Very thin concavity 46, having a depth of 20 micrometers or less, is formed at a position corresponding to notch 44 in the inner surface of sealed container 28.

Figure 11:
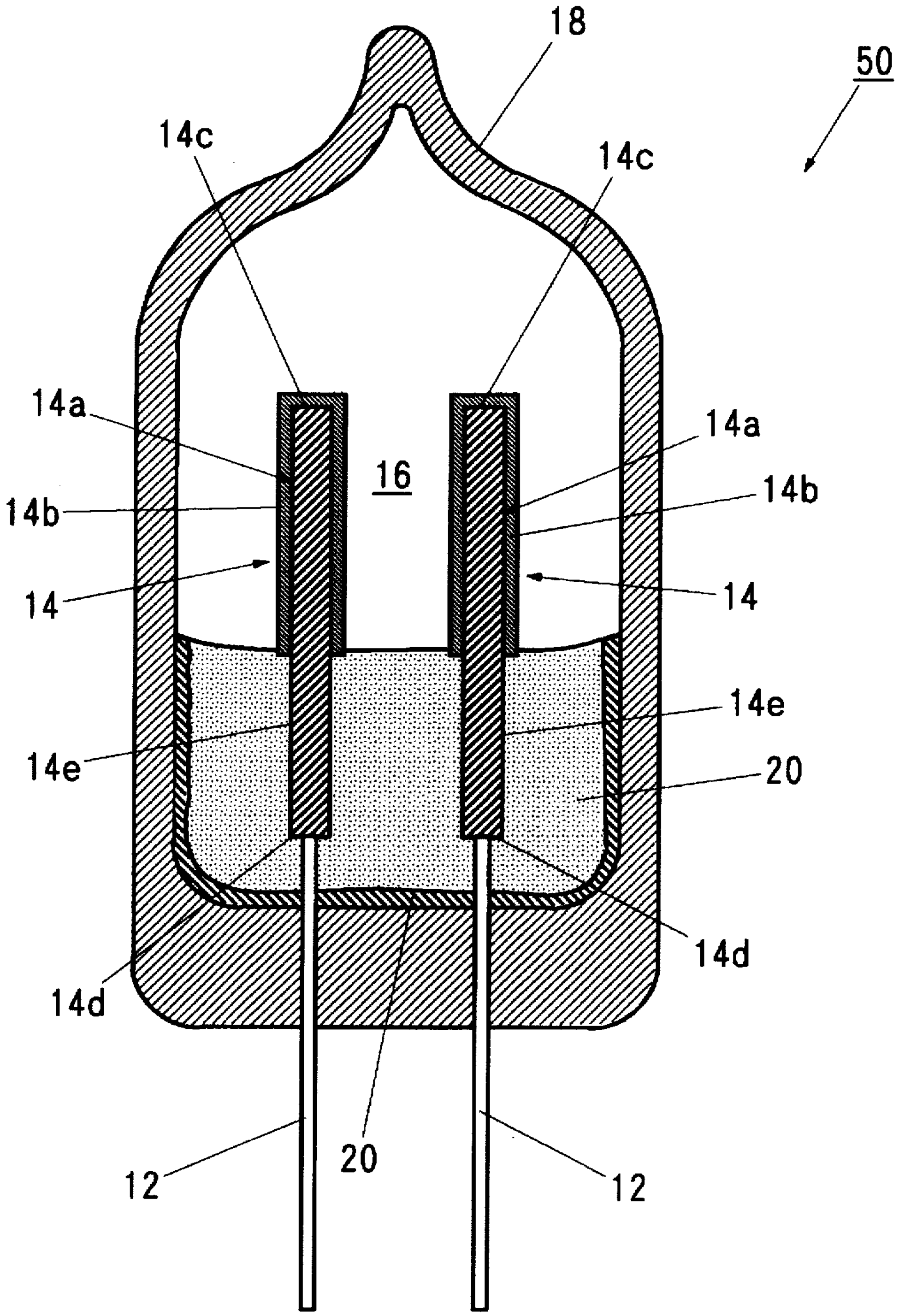
FIG. 11 is a cross-section drawing showing the sixth discharge-type surge absorbing element of the present invention.

In first discharge-type surge absorbing element 10, second discharge-type surge absorbing element 27, fourth discharge-type surge absorbing element 42, and fifth discharge-type surge absorbing element 48, emitter material is adhesed to the entire surface of electrode bases 14*a*, except for a small portion. This forms emitter layer 14*b* over roughly the entire area of electrode bases 14*a*. However, the present invention is not restricted to this. Referring to FIG. 11, for example, there is shown a sixth discharge-type surge absorbing element 50. In this configuration, emitter layers 14*b*, 14*b* cover only ends 14*c*, 14*c* of the pair of electrode bases, thus forming discharge electrodes 14, 14. Lead wires 12, 12, comprising dumet wire or the like, connect to base ends 14*d*, 14*d* of the exposed parts electrode bases.

Figure 12:
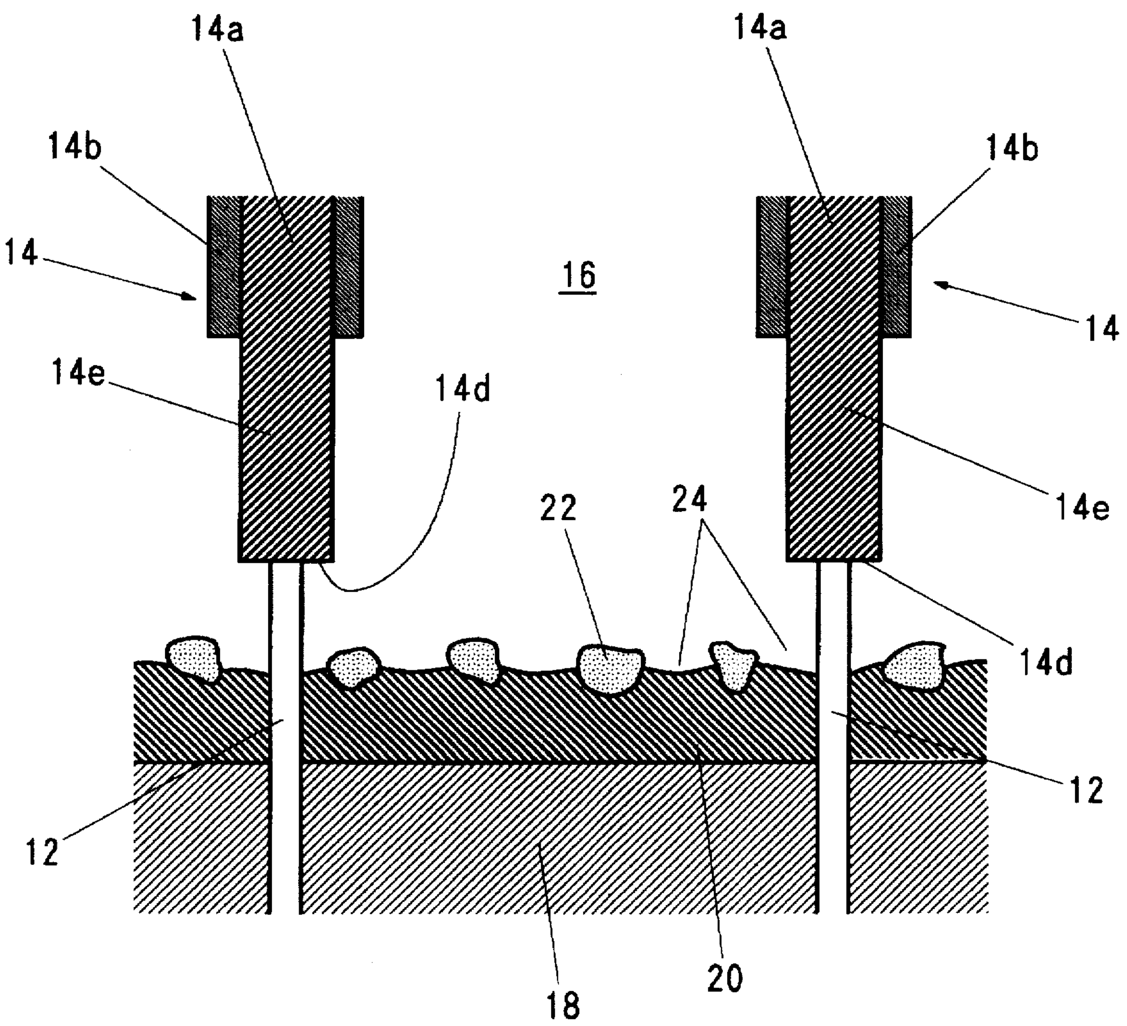
FIG. 12 is an enlarged cross-section drawing showing the area where the lead wires and the inner surface of the sealed container connect in the sixth discharge-type surge absorbing element.

In sixth discharge-type surge absorbing element 50, an emitter material such as barium carbonate is adhesed only to end 14*c* of electrode base, and base end 14*d* of the electrode base (the end connected to lead wire 12) is left exposed (the area where emitter material is adhesed should be two-thirds the overall length of electrode base 14*a* from end 14*c*). This pair of electrode base 14*a*, 14*a*, to which emitter material is adhesed only at end 14*c*, is inserted inside a glass tube from the bottom opening, in the same fashion as described above. The opening is collapsed and sealed, fixing the middle part of lead wires 12, 12. Heating and evacuation is performed in order to thermally decompose the barium carbonate in the emitter material, thus forming emitter layers 14*b*, 14*b* at ends 14*c*, 14*c* of electrode bases 14*a*, 14*a* . Layer 20, comprising mainly of nickel oxide, is formed on the inner surface of sealed container 18. Referring to FIG. 12, a plurality of secondary discharge electrodes 22, comprising particles of nickel, is disposed on layer 20, forming secondary discharge gaps 24 between lead wires 12, 12.

In sixth discharge-type surge absorbing element 50, an exposed portion 14*e* is disposed in emitter layer 14*b* on the lower end of electrode base 14*a* instead of forming an emitter layer instead of forming emitter layer 14*b* over the entire surface of electrode base 14*a*. This exposed portion 14*e* provides the material to form layer 20 and secondary discharge electrodes 22. Thus layer 20 can be formed with an adequate thickness on the lower end of the inner surface of sealed container 18, i.e. between lead wires 12, 12. Also, this allows secondary discharge electrodes 22 can also be disposed on layer 20 at with adequate density.

Referring to FIG. 11, layer 20 at the upper side of sealed container 18 is omitted in the drawing in order to emphasize layer 20 formed on the lower side. However, layer 20 is formed on the upper side of sealed container 18 as well.

By forming emitter layer 14*b* on electrode base 14*a* toward end 14*c*, it is possible to lower production costs by saving the relatively expensive emitter material. This also provides improved responsiveness to surges. Because electrode base 14*a* is formed as a long, thin shaft, and lead wire 12 is connected to base end 14*d* of electrode base 14*a*, the electric field strength between ends 14*c*, 14*c* of the electrode base is maximized by the edge effect. This facilitates the generation of discharge between the two ends. Therefore, the formation of emitter layer 14*b* only on ends 14*c* of the electrode bases provides a relatively small work function and a low discharge initiation voltage. This results in quicker initiation of discharge between ends 14*c*, 14*c* of the electrode bases compared to a configuration where emitter layer 14*b* is formed over the entire area of electrode base 14*a*.

Figure 13:
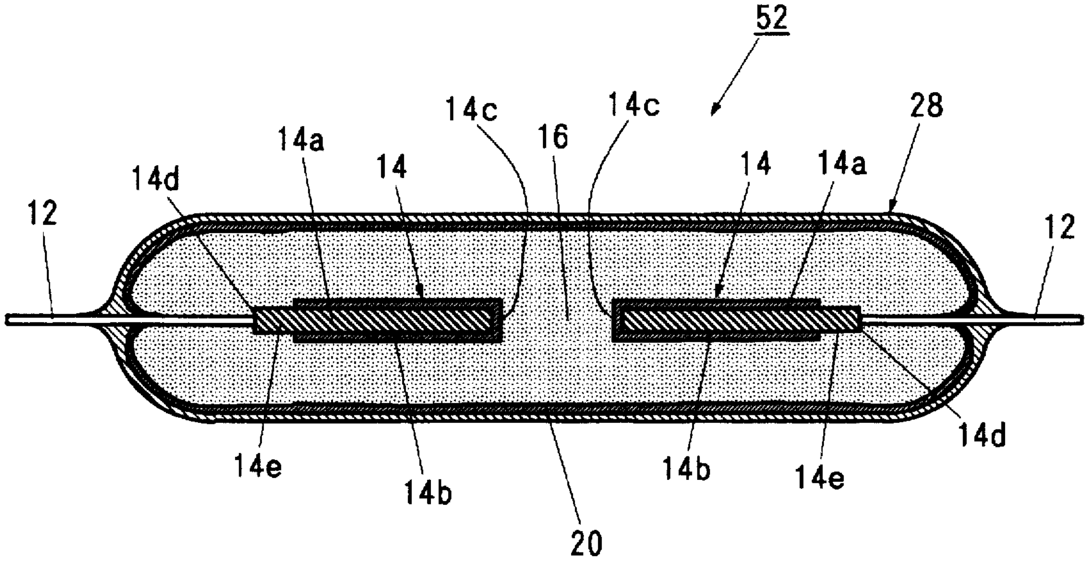
FIG. 13 is a cross-section drawing showing the seventh discharge-type surge absorbing element of the present invention.
Figure 14:
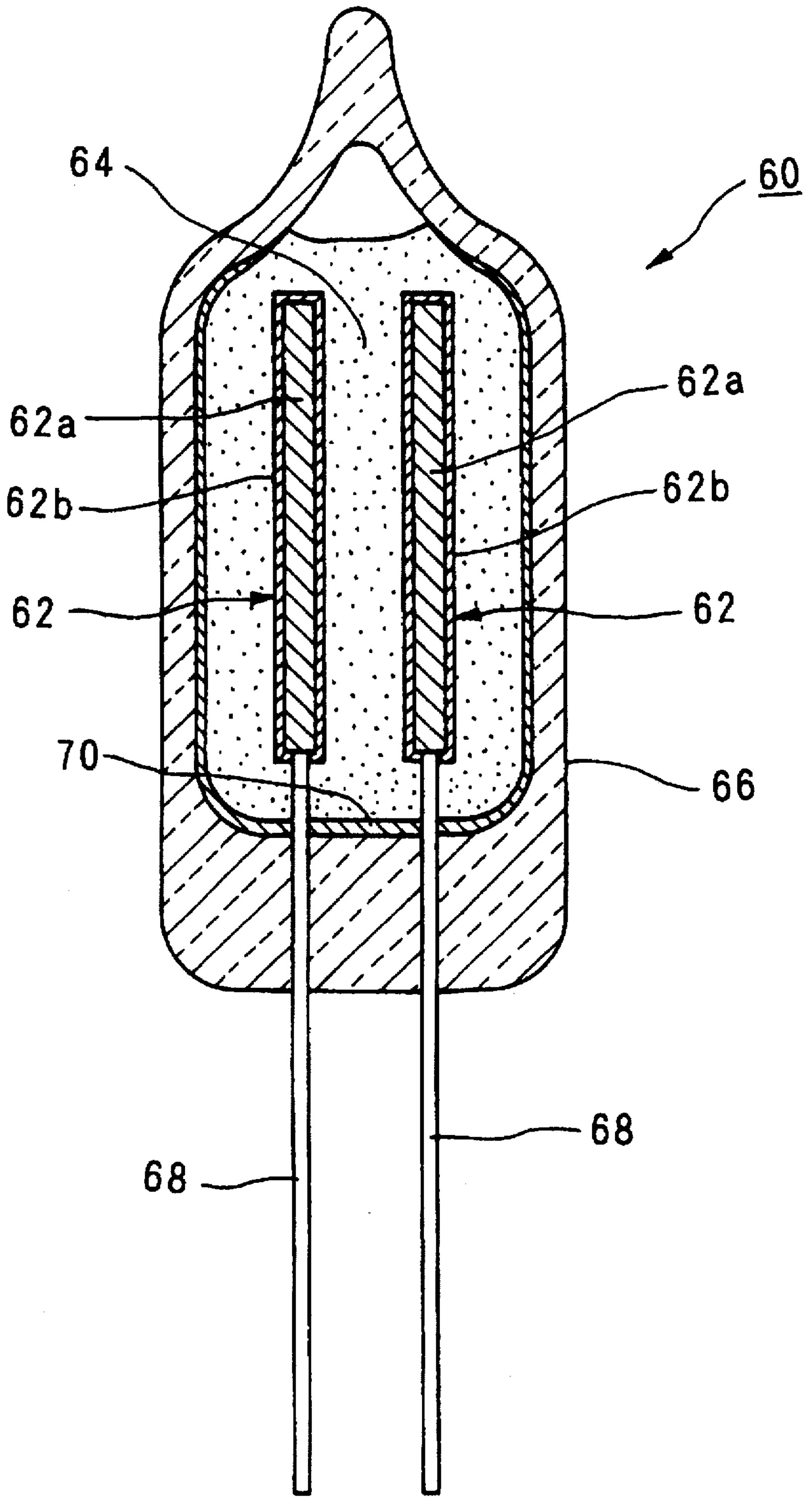
FIG. 14 is a cross-section drawing showing a prior art discharge-type surge absorbing element.
Figure 15:
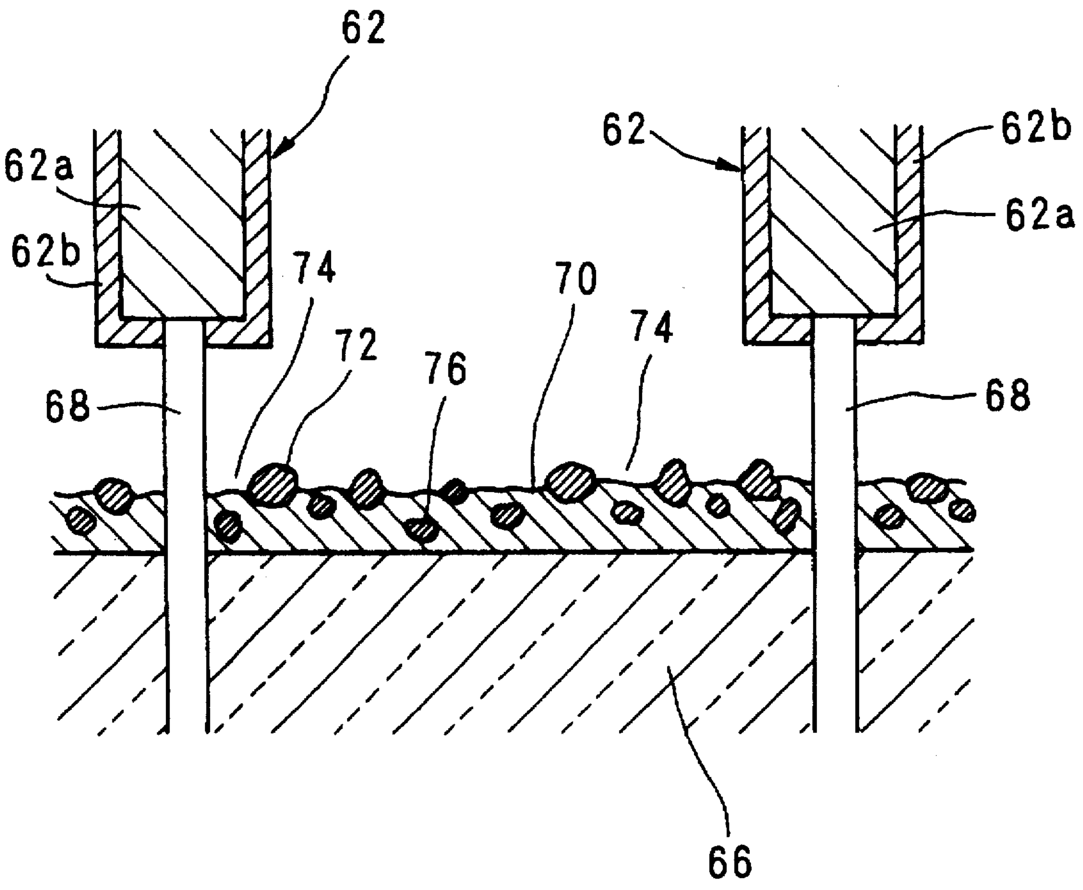
FIG. 15 is an enlarged cross-section drawing showing the area where the lead wires connect with the inner surface of the sealed container of a prior art surge absorbing element.

Referring to FIG. 13, there is shown a seventh discharge-type surge absorbing element 52 of the present invention. In this configuration, a pair of discharge electrodes 14, 14 are disposed opposite to each other so that their ends 14*c*, 14*c* are separated by discharge gap 16. This, along with discharge gas, is inserted into sealed container 28, formed by sealing a glass tube having two open ends. Lead wires 12, 12 extend in opposite direction from sealed container 28. Otherwise, the configuration is essentially the same as that of discharge-type surge absorbing element 50. Namely, discharge electrodes 14 are formed by an emitter layer **14*b* covering only the side of the electrode bases toward end 14*c*. Base ends 14*d*, at the exposed area of the electrode bases, are connected to lead wires 12, comprising dumet wire or the like. Layer 20 is formed from nickel oxide, which serves as a dielectric, and a plurality of secondary discharge electrodes are scattered on the surface of layer 20**.

In first discharge-type surge absorbing element 10, second discharge-type surge absorbing element 27, fourth discharge-type surge absorbing element 42 and fifth discharge-type surge absorbing element 48, only a very small portion of the surface of electrode bases **14*a* is exposed, and, essentially, very small exposed areas, such as from uneven application of emitter material or fissures in emitter layer 14*b*, are used to supply the material for layer 20 and secondary discharge electrode 22**.

It goes without saying, however, that it is possible for these embodiments to have a discharge electrode 14 with emitter layer **14*b* formed just on the side of electrode base 14*a* toward end 14*c*, with exposed portion 14*e* formed on base end 14*d*. This provides adequate material for forming layer 20 and secondary discharge electrode 22**.

By adjusting the settings of various conditions involved in the production process of sixth discharge-type surge absorbing element 50 and seventh discharge-type surge absorbing element 52, it is possible to give nickel oxide, which is the main ingredient in layer 20, semiconductor properties (it is known that by adjusting the temperatures in the production process and the like, it is possible to change the crystal structure of nickel oxide so that it acquires semiconductor properties). By adjusting various conditions in the production process in a similar manner, it would also be desirable in this case to add a relatively large amount of barium oxide, which makes up the emitter layer, inside layer 20.

If this is done, the load between the dielectrics can be maintained easier because there is a difference in the dielectric constant between glass in sealed container 18, 28 and the barium oxide in layer 20. Also, because barium oxide has a high photoelectric effect, a high load can be accumulated between layer 20 and the inner surface of sealed container 18, 28. Thus, when a surge beyond a certain fixed level is received via lead wire 12, 12 to seventh discharge-type surge absorbing element 52 or sixth discharge-type surge absorbing element 50, the semiconductor tunnel effect causes the electrical load described above to be transferred from one lead 12 to the other lead 12, via the nickel oxide in layer 20, which has acquired semiconductor properties. Current then flows between lead wires 12, 12, thus beginning surge absorption. (In sixth discharge-type surge absorbing element 50 and seventh discharge-type surge absorbing element 57, the load in layer 20 can be transferred because layer 20 disposed between lead wires 12, 12 is not divided by very small gap 21 or notch 44.)

At the same time, creeping corona discharge takes place at the surface of layer 20, and surge absorption takes place also through this creeping corona discharge. The load transfer in layer 20 and the creeping corona discharge on the surface of layer 20 results in the emission of electrons and ions in sealed container 18, 28. The priming effect of these electrons and ions transfers the creeping corona discharge across the secondary discharge gaps 24 over a short period of time, generating aerial discharge. The aerial discharge transfers across discharge gap 16, and finally the surge is absorbed by the high current of the arc discharge.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A discharge-type surge absorbing element wherein:

a plurality of discharge electrodes connected to lead wires are disposed opposite to each other within a sealed container filled with discharge gas, thus forming discharge gaps between said discharge electrodes;

said lead wires from said discharge electrodes are passed through said sealed container so that said lead wires extend externally;

a layer having good creeping discharge properties is formed on an inner surface of said sealed container at least between said lead wires, said layer being formed from a material used in said discharge electrodes; and a very small gap is formed between said lead wires and an end of said layer.

2. A discharge-type surge absorbing element wherein:

a plurality of discharge electrodes connected to lead wires are disposed opposite to each other within a sealed container filled with discharge gas, thus forming discharge gaps between said discharge electrodes;

said lead wires from said discharge electrodes are passed through said sealed container so that said lead wires extend externally;

a layer having good creeping discharge properties is formed on an inner surface of said sealed container at least between said lead wires, said layer being formed from a material used in said discharge electrodes; and a notch cut out from a part of said layer is formed on said inside surface of said sealed container at least between said lead wires.

3. A discharge-type surge absorbing element as described in claim 2 wherein:

a concavity is formed at a position corresponding to said notch on said inner surface of said sealed container.

4. A discharge-type surge absorbing element as described in claim 2 wherein:

said notch is formed as a band cutting across an area between said lead wires and having a width of 50–300 micrometers.

5. A discharge-type surge absorbing element as described in claim 1, further comprising a plurality of conductive secondary discharge electrodes formed from a material used in said discharge electrode and scattered on a surface of said layer, forming secondary discharge gaps between said lead wires that are more narrow than said discharge gap.

6. A discharge-type surge absorbing element as described in claim 1, wherein:

said discharge electrode comprises an emitter layer formed on a surface of a shaft-shaped electrode base connected to a lead wire, and said emitter layer is formed on a surface of said electrode base on a side closer toward a tip of said electrode base; and an exposed portion is formed on said surface of said electrode base where said emitter layer is absent toward an end connecting with said lead wire.

7. A discharge-type surge absorbing element as described in claim 6 wherein:

said exposed portion takes up one-third or more of the overall length of said electrode base.

8. A discharge-type surge absorbing element as described in claim 5 wherein:

said electrode base and said secondary discharge electrode comprise nickel; and said layer comprises mainly nickel oxide.

9. A discharge-type surge absorbing element as described in claim 1, wherein:

said discharge electrodes are disposed so that their bodies are parallel to each other and so that they are separated by a discharge gap; and said lead wires of said discharge electrodes extend out from said sealed container in a single direction.

10. A discharge-type surge absorbing element as described in claim 1, wherein:

said discharge electrodes are disposed so that their bodies are parallel to each other and so that they are separated by a discharge gap; and said lead wires of said discharge electrodes extend out from said sealed container in opposite directions.

11. A discharge-type surge absorbing element wherein:

a sealed container is formed by a case having two open ends, each of said openings being connected to a discharge electrode, which also serves as a cover;

a discharge gap is formed between ends of said discharge electrodes within said sealed container;

said sealed container is filled with a discharge gas;

a layer having good creeping discharge properties is formed on an inner surface of said case; and a very small gap is formed between said discharge electrode and an end of said layer.

12. A method for making a discharge-type surge absorbing element wherein:

a plurality of discharge electrodes connected to lead wires are disposed opposite to each other within a sealed container filled with discharge gas, thus forming discharge gaps between said discharge electrodes;

said lead wires from said discharge electrodes are passed through said sealed container so that said lead wires extend externally;

a layer having good creeping discharge properties is formed on an inner surface of said sealed container at least between said lead wires;

a very small gap is formed between said lead wire and an end of said layer;

said discharge electrode is heated in a depressurized nitrogen atmosphere so that a material making up said discharge electrode melts, scatters and oxidizes;

said oxidized material covers an inner surface of said sealed container, forming said layer; and said inner surface of said sealed container is melted in an area where said lead is connected, thus preventing said oxidized material from adhesing to a surface of said connecting area, and forming said very small gap.

13. A method for making a discharge-type surge absorbing element wherein:

a plurality of discharge electrodes connected to lead wires are disposed opposite to each other within a sealed glass container filled with discharge gas, thus forming discharge gaps between said discharge electrodes;

said lead wires from said discharge electrodes are passed through said sealed container so that said lead wires extend externally;

a layer having good creeping discharge properties is formed on an inner surface of said sealed container at least between said lead wires;

a notch eliminated from a portion of said layer is formed on said inner surface of said sealed container at least between said lead wires;

said discharge electrode is heated in a depressurized nitrogen atmosphere so that a material making up said discharge electrode melts, scatters and oxidizes;

said oxidized material covers an inner surface of said sealed container, forming said layer; and a laser beam is applied from outside said sealed container to evaporate a portion of said layer formed on said inner surface of said sealed container, thus forming said notch.

14. A method for making a discharge-type surge absorbing element wherein:

an emitter material is applied to a surface of a plurality of shaft-shaped electrode bases connected to lead wires;

said electrode bases are disposed within a container so that said bases are facing each other and are separated by a discharge gap;

a middle portion of said lead wires is fixed to said container and an end of said lead wires is extended out from said container;

heat is applied and evacuation of the contents of said container is performed;

said heat application thermally decomposes said emitter material, forming an emitter layer on a surface of said electrode bases, and melts said surface of said electrode base;

said evacuation procedure causes depressurization, scattering the material making up said electrode bases;

of said scattered material from said electrode bases, the material that is oxidized during scattering is adhesed to said inner surface of said container, thus forming a layer on said inner surface of said container at least between said lead wires;

the material not oxidized during scattering form a plurality of secondary discharge electrodes comprising particles or lumps scattered on a surface of said layer;

this forms secondary discharge gaps between said lead wires which are more narrow than said discharge gap;

said container is filled with discharge gas and said container is sealed;

said emitter material is adhered to an end of said electrode base to form said emitter layer;

said emitter material is not present at a surface of an end of said electrode base connected to a lead wire, thus forming an exposed portion;

said heat application and evacuation melts and scatters the surface of said exposed portion, thus forming said layer and said secondary electrodes.

* * * * *